(12) United States Patent
Colinge et al.

(10) Patent No.: US 9,853,150 B1
(45) Date of Patent: Dec. 26, 2017

(54) METHOD OF FABRICATING EPITAXIAL GATE DIELECTRICS AND SEMICONDUCTOR DEVICE OF THE SAME

(71) Applicant: TAIWAN SEMICONDUCTOR MANUFACTURING CO., LTD., Hsinchu (TW)

(72) Inventors: Jean-Pierre Colinge, Hsinchu (TW); Ken-Ichi Goto, Hsin-Chu (TW); ZhiQiang Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/236,541

(22) Filed: Aug. 15, 2016

(51) Int. Cl.
*H01L 21/28* (2006.01)
*H01L 29/78* (2006.01)
*H01L 29/51* (2006.01)
*H01L 29/66* (2006.01)

(52) U.S. Cl.
CPC .. *H01L 29/78391* (2014.09); *H01L 21/28291* (2013.01); *H01L 29/516* (2013.01); *H01L 29/6684* (2013.01); *H01L 29/785* (2013.01)

(58) Field of Classification Search
CPC ........... H01L 29/78391; H01L 29/6684; H01L 29/7851; H01L 21/28291
USPC ............................. 257/295; 438/3, 770–772
See application file for complete search history.

(56) References Cited

U.S. PATENT DOCUMENTS

| | | | | |
|---|---|---|---|---|
| 5,623,439 | A | * | 4/1997 | Gotoh ............... H01L 29/78391 257/295 |
| 6,096,127 | A | * | 8/2000 | Dimos ..................... C30B 5/00 117/9 |
| 7,425,740 | B2 | | 9/2008 | Liu et al. |
| 8,048,723 | B2 | | 11/2011 | Chang et al. |
| 8,053,299 | B2 | | 11/2011 | Xu |
| 8,183,627 | B2 | | 5/2012 | Currie |

(Continued)

OTHER PUBLICATIONS

J. Jo et al., Negative Capacitance in Organic/Ferroelectric Capacitor to Implement Steep Switching MOS Devices, Jun. 2015, Nano Letters, vol. 15, pp. 4553-4556.*

(Continued)

*Primary Examiner* — Victoria K Hall
(74) *Attorney, Agent, or Firm* — McClure, Qualey & Rodack, LLP (57) ABSTRACT

A method of fabricating epitaxial gate dielectric includes forming a $Sr_xBa_yM_zTiO_3$ gate dielectric on a fin, and $0 \le x$, y and $z \le 1$, $x+y+z=1$, and M is calcium or magnesium. One of x and y is not 0. The $Sr_xBa_yM_zTiO_3$ gate dielectric includes a plurality of $Sr_xBa_yM_zTiO_3$ dielectric films. Each of the $Sr_xBa_yM_zTiO_3$ dielectric films has different ratio of x, y, and z. The fin is then oxidized to form a silicon oxide in between the $Sr_xBa_yM_zTiO_3$ gate dielectric and the fin. A dielectric layer is disposed on the $Sr_xBa_yM_zTiO_3$ gate dielectric. Subsequently a metal gate layer is deposited on the dielectric layer.

20 Claims, 7 Drawing Sheets

(56) References Cited

U.S. PATENT DOCUMENTS

| | | | |
|---|---|---|---|
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 * | 8/2014 | Huang | H01L 29/66795 257/18 |
| 8,815,712 B2 | 8/2014 | Wan et al. | |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2015/0263003 A1 | 9/2015 | Lee et al. | |
| 2015/0311349 A1 * | 10/2015 | Ramaswamy | H01L 27/1159 257/295 |
| 2016/0308070 A1 * | 10/2016 | Chang | H01L 29/792 |
| 2016/0322368 A1 * | 11/2016 | Sun | H01L 29/78391 |
| 2016/0358915 A1 * | 12/2016 | Flachowsky | H01L 29/516 |
| 2017/0005195 A1 * | 1/2017 | Ching | H01L 29/7848 |

OTHER PUBLICATIONS

M. Kondo & K. Kurihara, Orientation Control of Perovskite Epitaxial Thin Film on Silicon Substrate with Yttria-Stabilized Zirconia Buffer Layers, Sep. 2006, Key Engineering Materials, vol. 320, pp. 69-72.*
C. Dubourdieu et al., Switching of ferroelectric polarization in epitaxial BaTiO3 films on silicon without a conducting bottom electrode, Oct. 2013, Nature Nanotechnology, vol. 8, pp. 748-754.*
Jae Hyo Park et al,"A Novel Metal-Ferroelectric-Insulator-Silicon FET With Selectively Nucleated Lateral Crystallized Pb(Zr,Ti)O3 and ZrTiO4 Buffer for Long Retention and Good Fatigue", IEEE Electron Device Letters, vol. 36, No. 10, Oct. 2015, p. 1033.
Asif Islam Khan et al,"Negative capacitance in a ferroelectric capacitor", Nature Materials 14, 182-186 (2015) doi:10.1038/nmat4148, Feb. 2015.
Jaesung Jo et al,"Negative Capacitance in Organic/Ferroelectric Capacitor to Implement Steep Switching MOS Devices", Nano Lett., 2015, 15 (7), pp. 4553-4556, Jun. 23, 2015, (abstract only).
Jae Hyo Park et al, "Sub-kT/q subthreshold slope p-metal-oxide-semiconductor field-effect transistors with single-grained Pb(Zr,Ti)O3 featuring a highly reliable negative capacitance", Appl. Phys. Lett. 108, 103504 Mar. 29, 2016.
Kai-Shin Li et al,"Sub-60mV-swing negative-capacitance FinFET without hysteresis", Technical Digest of IEDM, pp. 22.6.1-22.6.4, 2015.
J. Q. He et al,"Interfacial reaction in the growth of epitaxial SrTiO3 thin films on (001) Si substrates", J. Appl. Phys. 97, 104921 (2005).
M.D. McDaniel et al, "Epitaxial strontium titanate films grown by atomic layer deposition on SrTiO3-buffered Si(001) substrates", J. Vac. Sci. Technol. A 31, 01A136 (2013).
R.A. McKee et al., "Molecular beam epitaxy growth of epitaxial barium silicide, barium oxide, and barium titanate on silicon", Appl. Phys. Lett. 59, 782 (1991), Aug. 9, 1991.
Z. Li et al., "An epitaxial ferroelectric tunnel junction on silicon", Adv Mater. Nov. 12, 2014;26(42):7185-9. doi: 10.1002/adma. 201402527, Sep. 8, 2014.
M. Kondo et al., "Orientation Control of Perovskite Epitaxial Thin Film on Silicon Substrate with Yttria-Stabilized Zirconia Buffer Layers", Key Engineering Materials (vol. 320), pp. 69-72, 2006, Spe. 2006, (Abstract only).
R. A. McKee et al., "Crystalline Oxides on Silicon: The First Five Monolayers", Chisholm, Phys. Rev. Lett., vol. 81, No. 14 (1998), Oct. 5, 1998.
C. Dubourdieu et al., "Switching of ferroelectric polarization in epitaxial BaTiO3 films on silicon without a conducting bottom electrode", Nature Nanotechnology 8, 748-754 (2013) doi:10.1038/nnano.2013.192, Spe. 29, 2013, (Abstract only).

* cited by examiner

100

110 — Forming a ferroelectric gate material on a fin

120 — Forming a silicon oxide between the ferroelectric gate material and the fin 130 — Forming a metal gate layer on the ferroelectric gate material

210 — Forming a $Sr_xBa_yM_zTiO_3$ gate dielectric on a fin, wherein $0 \leq x, y$ and $z \leq 1$, $x + y + z = 1$, and M is calcium or magnesium 220 — oxidizing the fin 230 — Forming a metal gate layer on the $Sr_xBa_yM_zTiO_3$ gate dielectric

METHOD OF FABRICATING EPITAXIAL GATE DIELECTRICS AND SEMICONDUCTOR DEVICE OF THE SAME

BACKGROUND

For more than three decades, the continued miniaturization of metal oxide semiconductor field effect transistors (MOSFETS) has been driven by the market trend such as processor chips, mobile telephones, and memory devices. The semiconductor industry relies on the ability to reduce or scale the dimensions of its basic devices. However, there are growing signs that metal oxide semiconductor transistors are beginning to reach their traditional scaling limits.

This dimension reduction includes scaling dielectric layers in devices, which means dielectric materials cannot be overlooked. Common dielectric material has primarily been fabricated using silicon dioxide. An amorphous $SiO_2$ layer provides an electrically and thermodynamically stable material, where the interface of the $SiO_2$ layer with underlying silicon provides a high quality interface as well as superior electrical isolation properties. However, increased scaling and other requirements in electronic devices have created the need to use other materials as dielectric regions in a variety of electronic structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many crystalline oxides belong to the perovskite family, adopting the simple perovskite structure such as ABO3. An ideal perovskite structure has a high degree of asymmetry. These perovskite oxides turn out to be attractive materials in the field of semiconductors because of their common structure, and in addition, they have desirable properties, for example, being insulating or metallic, or ferroelectric. Ferroelectric substance shows properties that are thought to be of use in semiconductor devices, for example, the self-generating polarization, dielectric characteristic, piezo-electric characteristic, electric conductance characteristic, electrostrictive effect, and electro-optical effect. The ferroelectric substance having such properties that it is adapted to various semiconductor devices, including memory element, actuator element, filter element, element converting mechanical energy to electrical energy and optical switch element. Ferroelectric layers exhibit scalability, low voltage operation, and non-destructive readout, which are much desired in semiconductor devices.

When a ferroelectric substance is adapted to a memory element, it is expected to be in a simple perovskite structure (asymmetrical in its internal electrical charge distribution), which leads to the maximum polarization by applying a voltage in the vertical direction of a semiconductor substrate. Ferroelectric materials without or with low hysteresis are being contemplated for use in gate dielectric stacks because they are predicted to achieve sub-thermal sub-threshold slope (i.e., SS<60 mV/decade at T=300K).

To produce a sub-thermal subthreshold slope, a ferroelectric gate material needs to be deposited on top of a dielectric layer. Such dielectric layers are usually amorphous or polycrystalline. Examples of such dielectrics are $SiO_2$ and $HfO_2$. Any ferroelectric material deposited on an amorphous or polycrystalline material will be polycrystalline. Polycrystalline ferroelectric films show limited ferroelectric characteristics, especially a poor fatigue and short retention time, which are caused by depolarization of ferroelectric dielectric.

One of the main roles of dielectric insulator in a ferroelectric-containing gate is to prevent the reaction and inter-diffusion between the ferroelectric material and silicon. The precision and desired crystalline characteristics of the ferroelectric substance are interrupted due to the underlying amorphous dielectric insulator. Only when a ferroelectric film is in single crystalline orientation, its reproducibility and endurance can be fully exerted.

Figure 1:
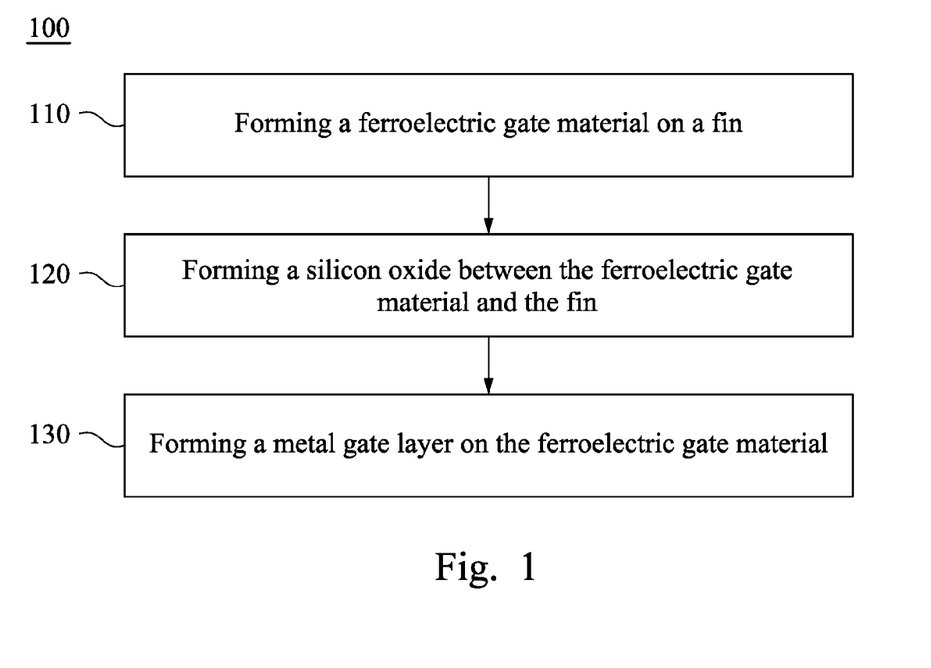
FIG. 1 is a block diagram illustrating an embodiment of a method of fabricating epitaxial gate dielectric in accordance with some embodiments of the instant disclosure.

Turning now to FIG. 1, illustrated is an embodiment of a method 100 of fabricating gate stack dielectrics including epitaxial ferroelectric materials. Embodiments of the method 100 shown in FIG. 1 are further illustrated in the schematic diagrams of FIGS. 3A through 3E, and reference should be made to theses figures as called out in the text below.

Figure 3A:
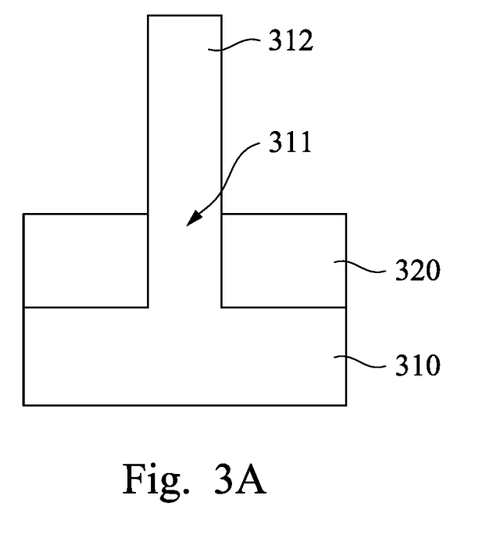
FIGS. 3A-3E are schematic diagrams illustrating embodiments of the method shown in FIG. 1.

As set forth in operation 110 in FIG. 1, a gate stack comprising a ferroelectric and a dielectric is formed on a channel region. Referring first to FIG. 3A, there is illustrated a first exemplary semiconductor structure that is provided after forming a vertical FinFET on an upper surface of a semiconductor substrate 310 in accordance with an embodiment of the instant disclosure. The first exemplary semiconductor structure that is shown in FIG. 3A can be used in the instant disclosure as a substrate for forming a transistor with a gate stack comprising a ferroelectric and a dielectric. In some embodiments, the transistor that is provided can be a ferroelectric memory transistor.

In some embodiments of the instant disclosure, the semiconductor substrate 310 can be a bulk semiconductor substrate. When a bulk semiconductor substrate is employed as semiconductor substrate 310, the bulk semiconductor substrate can include any semiconductor material, for example, Si, Ge, SiGe, SiC, and SiGeC. Multilayers of these semiconductor materials can also be used as the semiconductor material of the bulk semiconductor. In one embodiment, the semiconductor substrate 310 can be of a single crystalline semiconductor material, such as, for example, single crystalline silicon. In one embodiment, semiconductor substrate is a silicon-on-insulator (SOI) substrate, a SiGe-on-insulator (SiGeOI) substrate or a germanium-on-insulator (GeOI) substrate.

In some embodiments, an insulator layer is disposed on the upper surface of the semiconductor substrate 310. As shown in FIG. 3A, shallow trench isolations (STI) 320 are formed on the upper surface of the semiconductor substrate 310 so as to define a channel region 311 in between the shallow trench isolations 320. A fin 312 is formed in the channel region 311 and exceeds the height of the shallow trench isolations 320. The fin 312 is formed on the semiconductor substrate 310. In some embodiments, the fin 312 includes silicon layers and a silicon germanium layers disposed in succession.

Figure 3B:
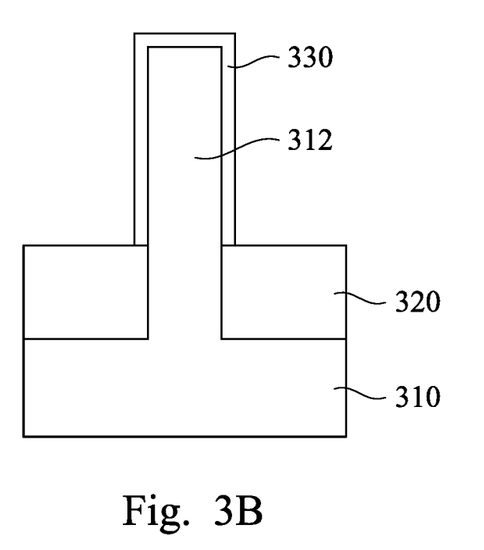

Attention is now directed to FIG. 3B, illustrating formation of a ferroelectric gate material. The ferroelectric gate material 330 is formed on the fin 312 as a blanket layer utilizing any epitaxial deposition method that can form such a layer. Examples of deposition processes that can be used include, but are not limited to, chemical vapour deposition (CVD), plasma enhanced chemical vapour deposition (PECVD), physical vapour deposition (PVD), sputtering, molecular beam epitaxy (MBE), sputtering, and atomic layer deposition (ALD). Epitaxial growth of thin films is facilitated by thermodynamic stability between the film and the substrate, as well as minimal lattice mismatch.

The ferroelectric gate material 330 can include any ferroelectric perovskite material. Examples of ferroelectric perovskites that can be used as the ferroelectric gate 330 include lead zirconate titanate ($PbZr_xTi_{1-x}O_3$ with $0 \leq x \leq 1$), barium strontium titanate ($Sr_xBa_{1-x}TiO_3$ with $0 \leq x \leq 1$), bismuth iron oxide ($BiFeO_3$), and strontium bismuth tantalate ($SrBi_2Ta_2O_9$). In some embodiments, the ferroelectric gate material 330 can be barium strontium titanate with some atoms of barium or strontium replaced by calcium (Ca) or magnesium (Mg) atoms.

In an epitaxial growth formation of a material composition having more than two elements, a cycle of epitaxial growth deposition may include a number of sequences to provide the elements of the composition. For example, a cycle for a molecular epitaxial growth formation of ferroelectric gate material 330, the ferroelectric material may have a common formula as $ABO_x$. The epitaxial growth may include sequentially pulsing precursor into the reaction chamber. In an embodiment, an epitaxial growth cycle may include a number of sequences for element A and a different number of sequences for element B. One precursor may contain the elements A and B, such that pulsing the AB containing precursor followed by its reactant precursor onto a substrate induce a reaction that forms $ABO_x$ on the fin 312. Alternatively, a cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness and composition of the ferroelectric gate material 330. The composition of the ferroelectric gate material 330 can be finely tuned in the cycles of epitaxial growth.

In one embodiment of the instant disclosure, the ferroelectric gate material 330 can have a thickness in a range from 0.5 nm to 10 nm, which is similar to a layer of a lattice structure.

In some embodiments of the instant disclosure, annealing under 200° C. may be performed after the formation of the ferroelectric gate material 330. Temperature higher than 200° C. is likely to induce titanium diffusion, which originates from the ferroelectric gate material 330. Titanium silicide forms at the interface between the ferroelectric gate material 330 and the fin results from the reaction between the titanium-containing ferroelectric and silicon. This ferroelectric gate material formation of a titanium silicide layer renders the functioning of a MOS transistor impossible.

Using the fin 312 as the foundation of the formation of ferroelectric gate material 330 leads to desirable lattice structure. In a conventional method of forming a gate stack, an oxide of silicon is disposed on the substrate, followed by subsequent depositions of other elements. Silicon oxide is an amorphous material and does not serve well as a platform to build a single crystalline layer. A layer grown over the silicon oxide can hardly be a single crystalline lattice structure. As previously discussed, ferroelectric material fully achieves its characteristics when it is formed as a single crystalline layer. The semiconductor substrate 310 or fin 312 has relatively uniform lattice structure compared with silicon oxide. When the fin 312 is put as the platform for the construction of the ferroelectric gate material 330, single crystalline ferroelectric gate material 330 can be achieved and lattice mismatching may be minimized. During epitaxial growth of the ferroelectric gate material 330, the direct contact with the fin 312 allows a stable foundation of the single crystalline ferroelectric gate material 330.

Figure 3C:
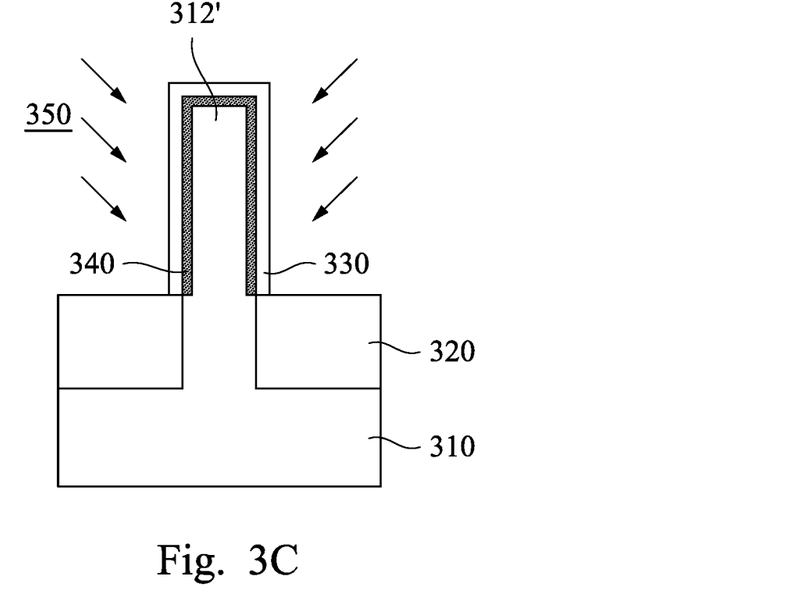

As set forth in operation 120 in FIG. 1, a silicon oxide is formed between the ferroelectric gate material and the fin. Attention is now directed to FIG. 3C, illustrating formation of the silicon oxide 340. After the formation of the epitaxial ferroelectric gate material 330, silicon oxide 340 is formed by oxidizing the fin 312 that is blanketed by the ferroelectric gate material 330. Oxygen 350 is forced through the ferroelectric gate material 330 and reacts with the fin 312 and the semiconductor substrate 310. Oxidation of the fin 312 is achieved by, for example, thermal oxidation, plasma oxidation, or high pressure oxidation. When an oxygen-containing agent is introduced into the reaction chamber, oxygen atoms 350 permeate the ferroelectric gate material 330 without altering its composition because the ferroelectric gate material 330 is a type of oxide itself, for example, $SrTiO_3$. The ferroelectric gate material 330 retains its single crystalline lattice structure and its ferroelectric properties. The oxygen 350 reacts with the silicon in the fin 312 and a portion of the semiconductor substrate 310 to form the silicon oxide 340.

Silicon oxide 340 is an electrically and thermodynamically stable material, where the interface of the silicon oxide 340 with underlying fin 312' provides an electrical isolation properties. Oxygen 350 does not consume the ferroelectric gate material 330. Instead, the interface between the fin 312 and the ferroelectric gate material 330, or more precisely, the surface of the fin 312 is where the oxidation occurs. The surface of fin 312' is oxidized to allow for the formation of silicon dioxide layer 340. After oxidation, the fin 312' is thinned due to a surface portion of the fin 312 being converted into the silicon oxide 340.

After part of the fin 312 is oxidized, in addition to the ferroelectric gate material 330, another dielectric layer, silicon oxide 340 is formed to provide sufficient electrical isolation. The silicon oxide 340 interposes in between the ferroelectric gate material 330 and the fin 312', and the ferroelectric gate material 330 is no longer in direct physical contact with the fin 312'. The ferroelectric gate material 330 retains its single crystalline lattice structure, and the silicon oxide 340 is formed without interrupting the structural integrity of the overlying ferroelectric gate material 330.

Figure 3D:
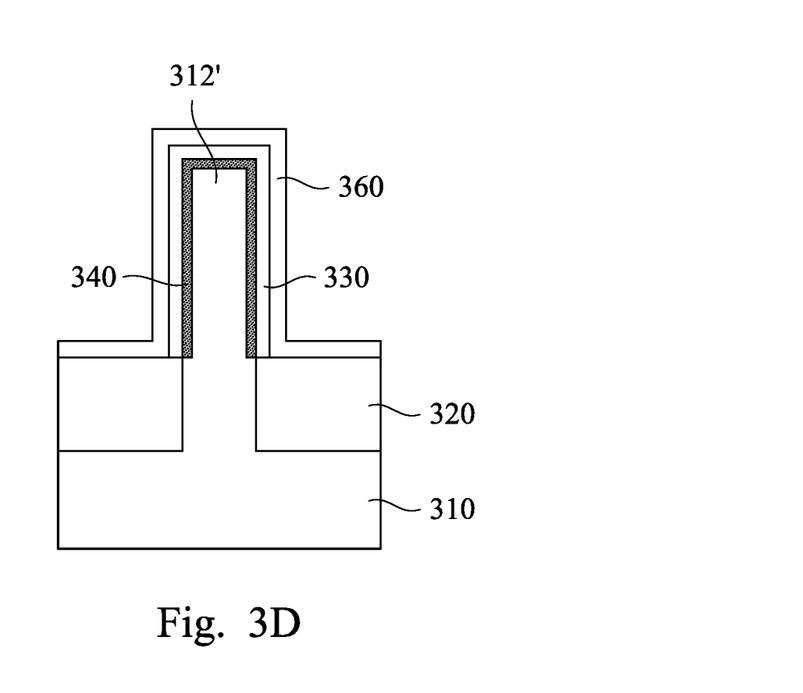

Attention is now directed to FIG. 3D, illustrating formation of a dielectric layer on the ferroelectric gate material. The dielectric layer 360 is deposited by, for example atomic layer deposition (ALD), over the ferroelectric gate material 330 and the shallow trench isolations 320. The dielectric layer 360 may be a dielectric material, for example, $HfO_2$ and HfSiON, that blankets the surface of the ferroelectric gate material 330 to reproduce the contour of the fin 312'. The dielectric layer 360 stretches to the surface of the shallow trench isolations 320, coating the exposed surface of the semiconductor substrate 310. In some embodiments, the dielectric layer 360 may be omitted, and the gate oxide includes the silicon oxide 340 and the ferroelectric gate material 330.

Figure 3E:
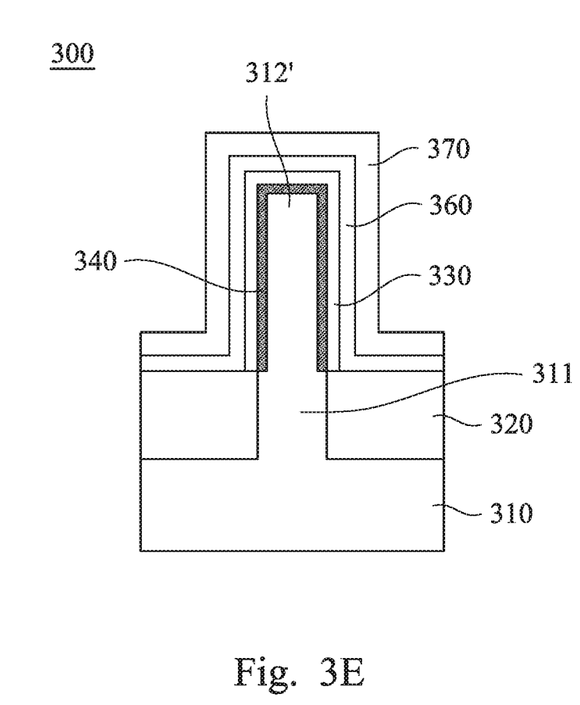

As set forth in operation 130 in FIG. 1, a metal gate layer is formed on the ferroelectric gate material. This is illustrated in FIG. 3E, illustrating a metal gate layer 370 coating the semiconductor substrate 310. In some embodiments, gate dielectric 360 is formed on the ferroelectric gate material 330, and the metal gate layer 370 is formed on the gate dielectric 360. The metal gate layer 370 may be, for example, metal nitride, or metal carbide. For example, tungsten, tantalum, aluminum, ruthenium, platinum, titanium nitride, tantalum nitride, titanium carbide, tantalum carbide, and a mixture thereof. The metal gate layer 370 may include multi-layers of the above-described materials. A gate stack 300 including ferroelectric gate material is then complete.

Figure 4A:
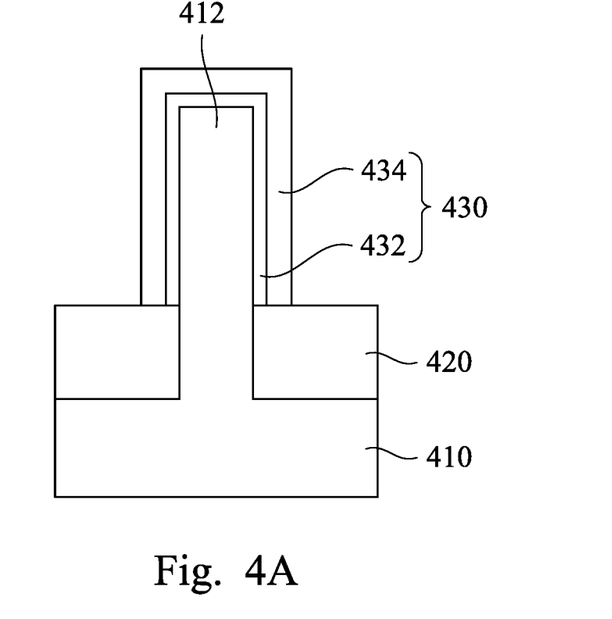
FIGS. 4A-4C are schematic diagrams illustrating embodiments of the method shown in FIG. 1.

Attention is now directed to FIG. 4A. FIG. 4A illustrates an embodiment of the method 100 in FIG. 1. The semiconductor substrate 410 is formed with shallow trench isolations 420, and a channel region is defined in between the shallow trench isolations 420. The fin 412 is formed in the channel region as a vertical fin in conventional FinFET device. Detailed information for achieving the structure as shown in FIG. 4A is similar to that described above with respect to FIGS. 3A and 3B. Identical components are interchangeable among the embodiments. It is not repeated hereinafter to satisfy the requirement of clarity and brevity.

Please refer back to FIG. 4A. The ferroelectric gate material 430 includes two ferroelectric films 432, 434. The first ferroelectric film 432 is formed on the fin 412 as a blanket layer utilizing any epitaxial deposition method, for example, CVD, PECVD, PVD, MBE, or ALD, that can form such a layer. The second ferroelectric film 434 is disposed on the first ferroelectric film 432, using the first ferroelectric film 432 as the foundation to grow a second single crystalline lattice structure. These two layers of ferroelectric films may be formed of different ferroelectric materials or the same. In some embodiments, the first and second ferroelectric films 432, 434 are of the same ferroelectric material, for example, $Sr_xBa_{1-x}TiO_3$ with $0 \leq x \leq 1$. The value x, however, may not be the same in each of the ferroelectric films. During the cycles of pulsing precursor gas, the first ferroelectric film 432 may have a higher amount of barium, and therefore the ratio of strontium in the composition drops. The second ferroelectric film 434 may have a ferroelectric film having a composition such as $SrTiO_3$. The value of x can be finely tuned in the epitaxial growth of the ferroelectric films. The first ferroelectric film 432 may have an x value that is suitable for minimizing lattice matching with the fin 412. The second ferroelectric film 434 may have an x value that is capable of tuning the potential barrier between the two stable polarization states of ferroelectric materials. The instant embodiment first and second ferroelectric films are examples in accordance with some embodiments of the instant disclosure, the numbers of ferroelectric films is not limited to two layers, and the cycles of epitaxial growth may vary.

The thickness of the ferroelectric films is in a range of from 0.5 nm to 10 nm. The ferroelectric materials include, for example, lead zirconate titanate, barium strontium titanate, bismuth iron oxide, and strontium bismuth tantalate. In some embodiments, the ferroelectric gate material 330 can be doped with calcium or magnesium.

Figure 4B:
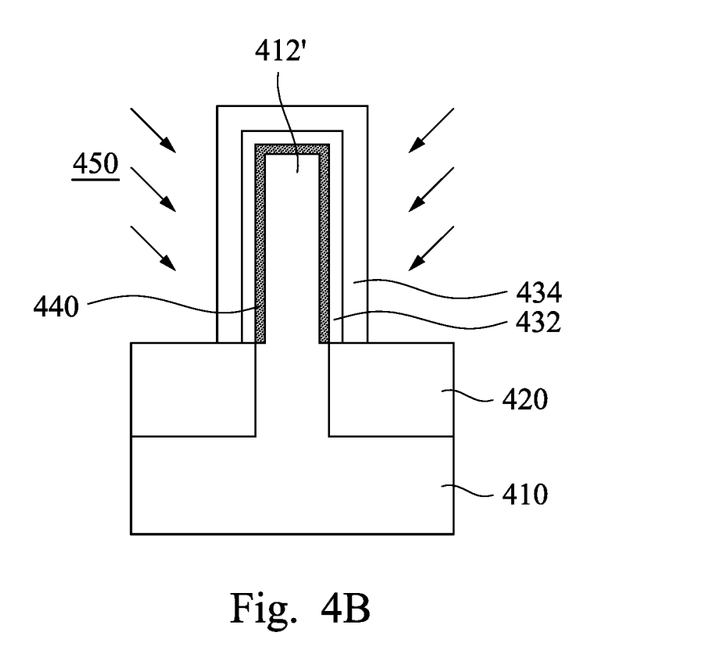

Attention is now directed to FIG. 4B, illustrating a silicon oxide 440 formed between the first ferroelectric film 432 and the fin 412'. After the formation of the ferroelectric gate material 430, which includes first and second ferroelectric films 432, 434, the silicon oxide 440 is formed by oxidizing the fin 412. Oxygen 450 is forced through the multiple-layered ferroelectric gate material 430 and reacts with the ferroelectric film-wrapped fin 412 and the semiconductor substrate 410. Oxygen 450 leaves ferroelectric gate material 430 intact, while the oxygen oxidizes the fin 412 to form the silicon oxide 440, lining the interface between the ferroelectric gate material 430 and the fin 412. Each of the ferroelectric films 432, 434 remain single crystalline lattice structure and its ferroelectric composition. After oxidation, the fin 412' is thinned due to a surface portion of the fin 412 is converted into the silicon oxide 440.

Figure 4C:
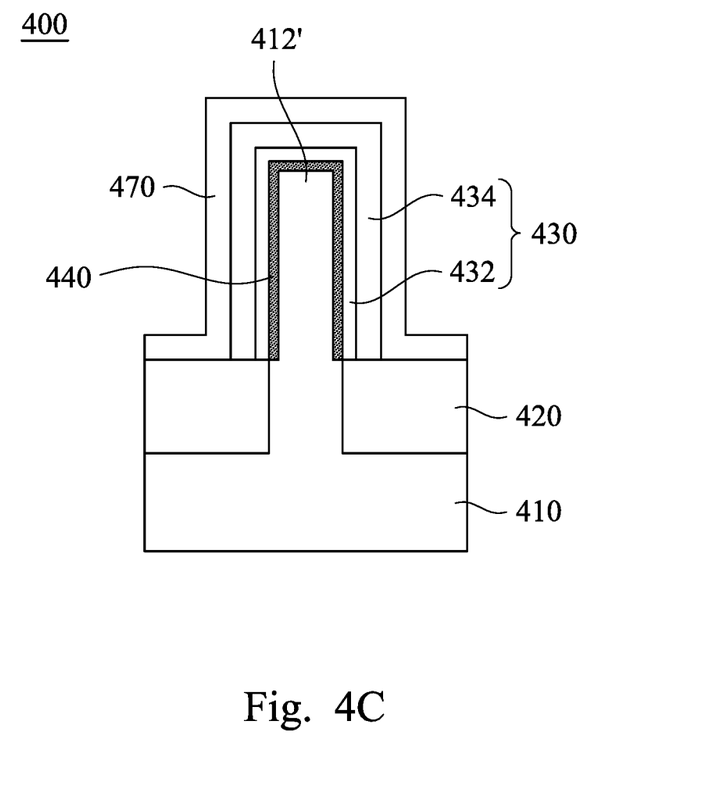

Attention is now directed to FIG. 4C, illustrating the metal gate layer 470 deposition. In some embodiments, a dielectric layer may be formed on the ferroelectric gate material 430 and covering the shallow trench isolations 420 before the formation of the metal gate layer 470. In the embodiment shown in FIG. 4C, this dielectric layer is omitted. The metal gate layer 470 is formed on the outermost ferroelectric film 434 of the ferroelectric gate material 430. A gate stack 400 including multiple-layered ferroelectric gate material is then complete.

Figure 5A:
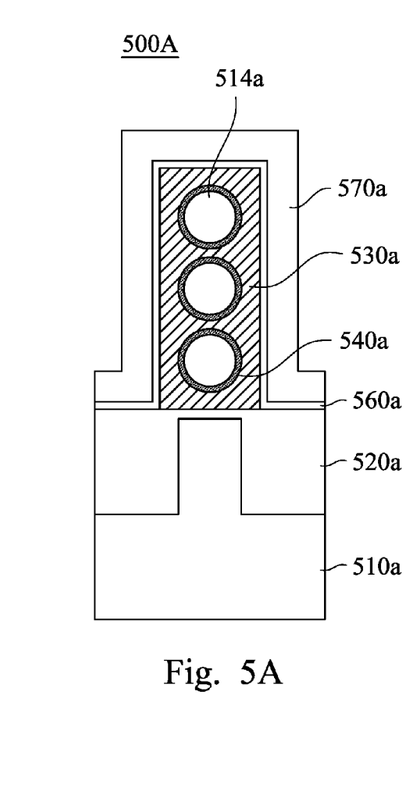
FIGS. 5A-5C are schematic diagrams illustrating embodiments of the method shown in FIG. 1.
Figure 5B:
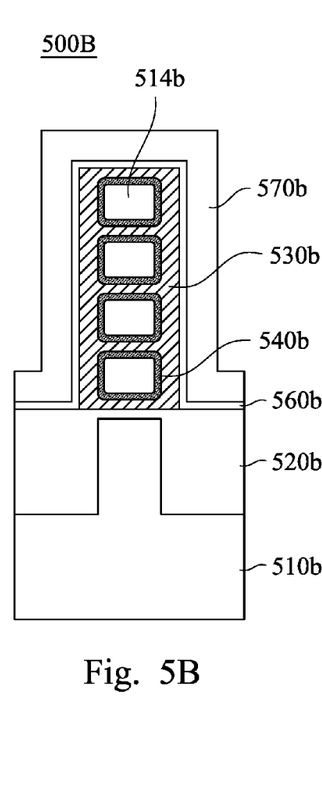
Figure 5C:
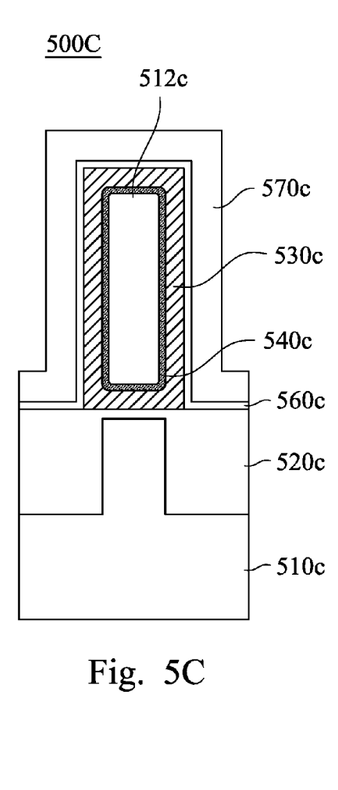

Attention is now directed to FIG. 5A through to 5C. The ferroelectric gate material can be used to other types of gate structures. Examples of these transistors are shown in FIGS. 5A-5C, which illustrates a horizontal nanowire transistor 500A and 500B, and gate-all-around fin 500C. Identical components are denoted with the same numeral digits with a, b, or c at the end to distinguish them from each of the transistors. The transistor 500A includes the semiconductor substrate 510a and shallow trench isolations 520a to define a channel region. The circular nanowires 514a are enveloped by the ferroelectric gate material 530a. The silicon oxide 540a is then formed by oxidizing the nanowires 514a, and a ring of silicon oxide 540a is formed around each of the circular nanowires 514a. The formation of the silicon oxide 540a reduces the surface area of the nanowires 514a due the reaction taking place between the oxygen and the nanowires 514a. The dielectric layer 560a blankets the ferroelectric gate material 530a, and the metal gate layer 570a coats the gate stack. Unlike the transistor 500A, the nanowires 514b of the transistor 500B have different shape from the nanowires 514a. Through post-ferroelectric oxidation, the silicon oxide 540b is formed and lines the surface of the nanowires 514b.

Figure 6:
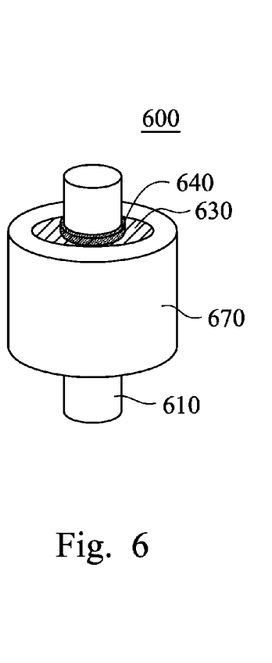
FIG. 6 is a schematic diagram illustrating an embodiment of the method shown in FIG. 1.

The gate-all around fin 500C includes a fin 512c enclosed from all sides by the ferroelectric gate material 530c. The silicon oxide 540c is then formed in between the fin 512c and the ferroelectric gate material 530c, following the contour of the fin 512c. The dielectric layer 560c and the metal gate layer 570c are the same as the transistors 500A and 500B. Attention is now directed to FIG. 6, illustrating a vertical nanowire 600. The source/drain region is at either terminal of the vertical nanowire 610. The gate region is surrounded by ferroelectric gate material 630, and the silicon oxide 640 is formed by oxidizing the nanowire 610 at the gate region. The metal gate layer 670 wraps around the ferroelectric gate material 630.

Figure 2:
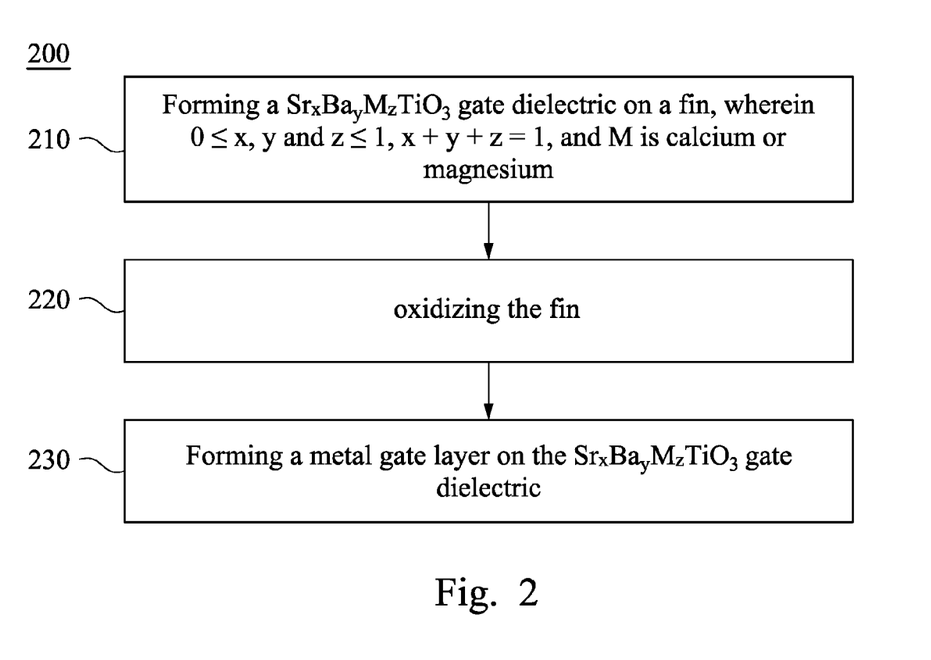
FIG. 2 is a block diagram illustrating am embodiment of a method of forming epitaxial gate dielectric in accordance with some embodiments of the instant disclosure.

Turning now to FIG. 2, illustrated is an embodiment of a method 200 of fabricating epitaxial gate dielectrics including ferroelectric materials. The difference between method 100 and method 200 arises from the ferroelectric gate material. Identical process of forming the gate dielectrics is not repeated hereinafter to avoid redundancy, and only the difference is elaborated.

As set forth in operation 210, an $Sr_xBa_yM_zTiO_3$ gate dielectric is formed on a fin, and $0 \leq x$, y and $z \leq 1$, $x+y+z=1$, and M is calcium or magnesium. Barium strontium titanate is used as the ferroelectric gate material in the method 200. Barium strontium titanate is one of the few ferroelectrics that can be grown epitaxially on silicon without interfacial reactions. Barium strontium titanate is strained when it is epitaxially grown on silicon, but this combination has relatively small lattice mismatch when the ratio of barium and strontium is carefully controlled. For example, a ferroelectric gate material may be, for example, SrTiO3, BaTiO3, $Sr_{0.7}Ba_{0.3}TiO_3$, or $Sr_{0.3}Ba_{0.5}Ca_{0.2}TiO_3$. The value of x, y, and z has to satisfy the equation in which x+y+z is equal to 1. Given this requirement, the value of x, y, and z is independently selected from any number between 0 and 1. In order to satisfy as a ferroelectric material, only one of x or y can be 0 at the same time. That is, either strontium or barium has to be present in the ferroelectric gate material, and x and y cannot be both 0. Single crystalline barium strontium titanate can be grown on the fin and integrated as the gate dielectric.

The ferroelectric gate material may include multiple layers of single crystalline $Sr_xBa_yM_zTiO_3$ dielectric films. Each of the $Sr_xBa_yM_zTiO_3$ dielectric films may have different ratio of x, y and z or the same. The ratio of x, y, z can be determined by a few factors, for example, lattice matching with the underlying fin, and potential barrier between the two stable states of the ferroelectric materials.

As set forth in operation 220, the fin is oxidized to form a silicon oxide at the interface between the $Sr_xBa_yM_zTiO_3$ gate dielectric and the fin. The $Sr_xBa_yM_zTiO_3$ gate dielectric does not react with the pulsing oxygen because $Sr_xBa_yM_zTiO_3$ gate dielectric is itself an oxide. Oxygen goes through the layers of $Sr_xBa_yM_zTiO_3$ gate dielectric and reacts with the silicon-containing fin. A surface portion of the fin is consumed by oxygen and converted into silicon oxide as part of the gate dielectric stack. After oxidation, the $Sr_xBa_yM_zTiO_3$ gate dielectric is no longer in direct physical contact with the fin. The silicon oxide is interposed in between the fin and $Sr_xBa_yM_zTiO_3$ gate dielectric.

As set forth in operation 230, the metal gate layer is formed on the $Sr_xBa_yM_zTiO_3$ gate dielectric. In some embodiments, the $Sr_xBa_yM_zTiO_3$ gate dielectric has a plurality of $Sr_xBa_yM_zTiO_3$ dielectric films, and the metal gate layer is disposed on the outermost $Sr_xBa_yM_zTiO_3$ dielectric film. A dielectric layer may be disposed on the $Sr_xBa_yM_zTiO_3$ gate dielectric before the formation of the metal gate layer. A single crystalline ferroelectric gate stack is then complete.

Please refer back to FIG. 3E, illustrating a semiconductor device 300 including ferroelectric gate material. The semiconductor device 300 includes a semiconductor substrate 310, and a pair of shallow trench regions 320 is formed on the semiconductor substrate 310 to define a channel region 311. The fin 312' projects from the surface of the semiconductor substrate 310 and is above the shallow trench isolations 320. The exposed surface of the fin 312' is coated with multiple layers of elements in succession. An amorphous oxide layer 340, for example, silicon oxide, blankets the fin 312' and extends further down to the shallow trench isolation regions 320. The oxide layer 340 narrows down the thickness of the fin 312' and is formed on a surface of the fin 312'. At least one single crystalline ferroelectric gate material 330 is disposed on the oxide layer 340. The single crystalline ferroelectric gate material 330 contains ferroelectric materials, for example, $Sr_xBa_yM_zTiO_3$. In some embodiments, the single crystalline ferroelectric gate material 330 includes a plurality of $Sr_xBa_yM_zTiO_3$ dielectric films, each of which is single crystalline due to the epitaxial relationship with the underlying fin 312'. The metal gate layer 370 is formed on the single crystalline ferroelectric gate material 330. In some embodiments, the dielectric layer 360 is disposed on the single crystalline ferroelectric gate material 330, and the metal gate layer 370 is therefore disposed on the dielectric layer 360.

Due to the epitaxial growth on a silicon containing substrate, the single crystalline ferroelectric gate material can be achieved. With the single crystalline ferroelectric gate material, ferroelectric material can exert ferroelectric property to its full and provide fatigue free, fast, and longer retention.

In some embodiments of the instant disclosure, a method of fabricating epitaxial gate dielectric includes forming a ferroelectric gate material on a fin. A silicon oxide is then formed in between the ferroelectric gate material and the fin. A metal gate layer is then deposited on the ferroelectric gate material.

In some embodiments of the instant disclosure, a method of fabricating an epitaxial gate dielectric includes forming a $Sr_xBa_yM_zTiO_3$ gate dielectric on a fin, and $0 \leq x$, y and $z \leq 1$, x+y+z=1, and M is calcium or magnesium. The fin is then oxidized to form a silicon oxide, and subsequently a metal gate layer is deposited on the $Sr_xBa_yM_zTiO_3$ gate dielectric.

In some embodiments of the instant disclosure, a semiconductor device includes a semiconductor substrate having a fin. An amorphous oxide layer is disposed on the fin, and a single crystalline ferroelectric gate material coats the amorphous oxide layer. A metal gate layer is disposed on the single crystalline ferroelectric gate material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating epitaxial gate dielectrics, comprising:
   forming a ferroelectric gate material on a fin;
   forming a silicon oxide between the ferroelectric gate material and the fin; and
   forming a metal gate layer on the ferroelectric gate material.

2. The method of fabricating epitaxial gate dielectrics according to claim 1, wherein forming the ferroelectric gate material on the fin includes epitaxially growing the ferroelectric gate material.

3. The method of fabricating epitaxial gate dielectrics according to claim 1, wherein forming the ferroelectric gate material on the fin includes forming a plurality of ferroelectric films.

4. The method of fabricating epitaxial gate dielectrics according to claim 3, wherein forming the plurality of ferroelectric films includes varying an amount of a ferroelectric material.

5. The method of fabricating epitaxial gate dielectrics according to claim 4, wherein the ferroelectric material includes strontium and barium.

6. The method of fabricating epitaxial gate dielectrics according to claim 1, wherein forming the silicon oxide between the ferroelectric gate material and the fin includes oxidizing the fin.

7. The method of fabricating epitaxial gate dielectrics according to claim 6, wherein oxidizing the fin includes thermal oxidation, plasma oxidation, and high-pressure oxidation.

8. The method of fabricating epitaxial gate dielectrics according to claim 1, further comprising:
   forming a dielectric layer on the ferroelectric gate material.

9. A method of forming epitaxial gate dielectrics comprising:
   forming a $Sr_xBa_yM_zTiO_3$ gate dielectric on a fin, wherein $0 \le x$, y and $z \le 1$, $x+y+z=1$, x is not equal to y, and M is calcium or magnesium;
   oxidizing the fin; and
   forming a metal gate layer on the $Sr_xBa_yM_zTiO_3$ gate dielectric.

10. The method of forming epitaxial gate dielectrics according to claim 9, wherein forming the $Sr_xBa_yM_zTiO_3$ gate dielectric on the fin includes epitaxially growing the $Sr_xBa_yM_zTiO3$ gate dielectric.

11. The method of forming epitaxial gate dielectrics according to claim 9, wherein forming the $Sr_xBa_yM_zTiO_3$ gate dielectric on the fin includes forming a plurality of $Sr_xBa_yM_zTiO_3$ dielectric films.

12. The method of forming epitaxial gate dielectrics according to claim 11, wherein forming the plurality of $Sr_xBa_yM_zTiO_3$ dielectric films includes varying the amount of x, y, and z of each of the $Sr_xBa_yM_zTiO_3$ dielectric films.

13. The method of forming epitaxial gate dielectrics according to claim 9, further comprising:
   forming a dielectric layer on the $Sr_xBa_yM_zTiO_3$ gate dielectric.

14. The method of forming epitaxial gate dielectrics according to claim 11, wherein forming the plurality of $Sr_xBa_yM_zTiO_3$ dielectric films includes:
   forming a first $Sr_xBa_yM_zTiO_3$ dielectric film on the fin; and
   forming a second $Sr_xBa_yM_zTiO_3$ dielectric film on the first $Sr_xBa_yM_zTiO_3$ dielectric film, wherein x of the first $Sr_xBa_yM_zTiO_3$ dielectric film and the second $Sr_xBa_yM_zTiO_3$ dielectric film are different.

15. A method of forming epitaxial gate dielectrics, the method comprising:
   forming a fin on a semiconductor substrate;
   forming a ferroelectric gate material on the fin;
   oxidizing the fin to form a silicon oxide between the fin and the ferroelectric gate material; and
   forming a metal gate layer on the ferroelectric gate material.

16. The method of claim 15, wherein the oxidizing the fin comprises thermal oxidation, plasma oxidation, and high-pressure oxidation.

17. The method of claim 15, wherein the forming the ferroelectric gate material comprises epitaxially growing a $Sr_xBa_yM_zTiO_3$ gate dielectric film on the fin, wherein $0 \le x$, y and $z \le 1$, $x+y+z=1$, x is not equal to y, and M is calcium or magnesium.

18. The method of claim 16, further comprising:
   forming a plurality of $Sr_xBa_yM_zTiO_3$ ferroelectric films on the fin; and
   varying the amount of x, y and z in each of the $Sr_xBa_yM_zTiO_3$ ferroelectric films.

19. The method of claim 15, wherein the ferroelectric gate material comprises strontium and barium.

20. The method of claim 15, further comprising:
   forming a dielectric layer on the ferroelectric gate material.

* * * * *